US012328868B2

(12) United States Patent
Tsai

(10) Patent No.: US 12,328,868 B2
(45) Date of Patent: Jun. 10, 2025

(54) MEMORY STRUCTURE INCLUDING LOW DIELECTRIC CONSTANT CAPPING LAYER

(71) Applicant: NANYA TECHNOLOGY CORPORATION, New Taipei (TW)

(72) Inventor: Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 445 days.

(21) Appl. No.: 17/814,235

(22) Filed: Jul. 22, 2022

(65) Prior Publication Data

US 2024/0032278 A1    Jan. 25, 2024

(51) Int. Cl.
| | |
|---|---|
| *H01L 21/02* | (2006.01) |
| *H01L 21/764* | (2006.01) |
| *H01L 21/768* | (2006.01) |
| *H10B 12/00* | (2023.01) |

(52) U.S. Cl.
CPC ....... *H10B 12/34* (2023.02); *H01L 21/02362* (2013.01); *H01L 21/764* (2013.01); *H01L 21/7682* (2013.01); *H01L 21/76829* (2013.01); *H01L 21/76831* (2013.01); *H01L 21/76832* (2013.01); *H01L 21/76834* (2013.01); *H01L 21/76835* (2013.01); *H10B 12/053* (2023.02); *H10B 12/488* (2023.02); *H01L 2221/1042* (2013.01); *H01L 2221/1047* (2013.01); *H01L 2221/1057* (2013.01); *H10B 12/482* (2023.02); *H10B 12/485* (2023.02)

(58) Field of Classification Search
None
See application file for complete search history.

(56) References Cited

U.S. PATENT DOCUMENTS

| | | | |
|---|---|---|---|
| 2018/0158828 A1* | 6/2018 | Han | H01L 21/76804 |
| 2020/0395363 A1 | 12/2020 | Kim et al. | |
| 2022/0037328 A1* | 2/2022 | Kim | H10B 12/488 |
| 2022/0059543 A1* | 2/2022 | Mun | H10B 12/482 |
| 2022/0223599 A1* | 7/2022 | Yang | H10B 12/315 |
| 2023/0085456 A1* | 3/2023 | Chae | H01L 21/76224 |
| | | | 257/253 |

(Continued)

FOREIGN PATENT DOCUMENTS

| | | |
|---|---|---|
| TW | 201142842 A | 12/2011 |
| TW | 201907545 A | 2/2019 |
| TW | 202141759 A | 11/2021 |

*Primary Examiner* — Nicholas J Tobergte
*Assistant Examiner* — William Henry Anderson
(74) *Attorney, Agent, or Firm* — CKC & Partners Co., LLC

(57) ABSTRACT

A memory structure is described, which includes a substrate, a word line structure, a bit line contact, and a bit line. The substrate has a trench. The word line structure is disposed in the trench of the substrate. The word line structure includes a word line, a gate dielectric layer, and a capping layer. The word line is disposed in the trench. The gate dielectric layer is disposed between the word line and the substrate. The capping layer covers the word line. The capping layer includes a first material film, and a dielectric constant of the first material layer is smaller than a dielectric constant of silicon nitride. The bit line contact is disposed on a portion of the trench and a portion of the capping layer. The bit line is disposed over the bit line contact and electrically connected to the bit line contact.

16 Claims, 3 Drawing Sheets

(56) References Cited

U.S. PATENT DOCUMENTS

| | | | |
|---|---|---|---|
| 2023/0157036 A1* | 5/2023 | Yang | H10B 12/0335 257/213 |
| 2023/0189500 A1* | 6/2023 | Lo | H10B 12/0335 257/296 |

* cited by examiner

MEMORY STRUCTURE INCLUDING LOW DIELECTRIC CONSTANT CAPPING LAYER

BACKGROUND

Field of Invention

The present disclosure relates to a semiconductor structure, and more particularly to a memory structure.

Description of Related Art

A dynamic random access memory (DRAM) device is a random access memory device that stores digital bit information in individual capacitors in a memory circuit. Typically, memory cells of the dynamic random access memory are composed of a capacitor and a transistor, and are arranged in an array. Vertical transistors have been developed.

As the integration of the memory device increasingly rises, the parasitic capacitance and the leakage current degrade the performance of the memory device. For example, the bit-line parasitic capacitance impacts the signal margin of the dynamic random access memory during operation due to the charge sharing effect. Therefore, a novel structure for reducing the parasitic capacitance and the leakage current of the memory device is required.

SUMMARY

Therefore, one objective of the present disclosure is to provide a memory structure, in which a low dielectric constant material is used to form a capping layer of a word line structure, such that the bit line parasitic capacitance is reduced, and the gate induced drain leakage (GIDL) current is lowered, thereby increasing a signal margin of the memory structure during operation.

According to the aforementioned objectives of the present disclosure, a memory structure is provided. The memory structure includes a substrate, a word line structure, a bit line contact, and a bit line. The substrate has a trench. The word line structure is disposed in the trench of the substrate. The word line structure includes a word line, a gate dielectric layer, and a capping layer. The word line is disposed in the trench. The gate dielectric layer is disposed between the word line and the substrate. The capping layer covers the word line. The capping layer includes a first material film, and a dielectric constant of the first material film is smaller than a dielectric constant of silicon nitride. The bit line contact is disposed on a portion of the trench and a portion of the capping layer. The bit line is disposed over the bit line contact and electrically connected to the bit line contact.

According to one embodiment of the present disclosure, the word line includes a first layer and a second layer on the first layer, and the first layer and the second layer have different materials.

According to one embodiment of the present disclosure, a material of the first layer includes metal, and a material of the second layer includes semiconductor.

According to one embodiment of the present disclosure, a material of the first layer includes tungsten, and a material of the second layer includes polysilicon.

According to one embodiment of the present disclosure, the gate dielectric layer conformally covers a bottom surface and a side surface of the trench.

According to one embodiment of the present disclosure, the first material film of the capping layer includes silicon oxide.

According to one embodiment of the present disclosure, the capping layer further includes a second material film disposed on the first material film, and a dielectric constant of the second material film is different from a dielectric constant of the first material film.

According to one embodiment of the present disclosure, the dielectric constant of the second material film is greater than the dielectric constant of the first material film.

According to one embodiment of the present disclosure, the second material film includes silicon nitride.

According to one embodiment of the present disclosure, a thickness of the first material film is 20% or more than 20% of a thickness of the capping layer.

According to one embodiment of the present disclosure, the first material film extends at least from a side surface of the bit line contact beyond a bottom surface of the bit line contact.

According to one embodiment of the present disclosure, the memory structure further includes an air gap disposed in the capping layer adjacent to the side surface of the bit line contact, in which a bottom of the air gap is lower than the bottom surface of the bit line contact.

According to the aforementioned objectives of the present disclosure, a memory structure is provided. The memory structure includes a substrate, a word line structure, an isolation layer, a bit line contact, and a bit line. The substrate has a trench. The word line structure is disposed in the trench of the substrate. The word line structure includes a word line, a gate dielectric layer, and a capping layer. The word line is disposed in the trench. The gate dielectric layer is disposed between the word line and the substrate. The capping layer is disposed in the trench and covers the word line. The capping layer includes a first material film and a second material film disposed on the first material film, and a dielectric constant of the first material film is different from a dielectric constant of the second material film. The isolation layer is disposed on the capping layer and the gate dielectric layer. The bit line contact is disposed in the isolation layer and on a portion of the trench and a portion of the capping layer. The bit line is disposed over the bit line contact and electrically connected to the bit line contact.

According to one embodiment of the present disclosure, the word line includes a first layer and a second layer on the first layer, and the first layer and the second layer have different materials.

According to one embodiment of the present disclosure, a material of the first layer includes tungsten, and a material of the second layer includes polysilicon.

According to one embodiment of the present disclosure, the dielectric constant of the first material film is smaller than the dielectric constant of the second material film.

According to one embodiment of the present disclosure, a thickness of the first material film is 20% or more than 20% of a thickness of the capping layer.

According to one embodiment of the present disclosure, the first material film extends at least from a side surface of the bit line contact beyond a bottom surface of the bit line contact.

According to one embodiment of the present disclosure, the memory structure further includes an air gap disposed in the capping layer adjacent to the side surface of the bit line contact, in which a bottom of the air gap is lower than the bottom surface of the bit line contact.

According to one embodiment of the present disclosure, the air gap extends from the isolation layer along the side surface of the bit line contact beyond the bottom surface of the bit line contact.

BRIEF DESCRIPTION OF THE DRAWINGS

The aforementioned and other objectives, features, advantages, and embodiments of the present disclosure can be more fully understood by reading the following detailed description of the embodiment, with reference made to the accompanying drawings as follows.

DETAILED DESCRIPTION

Figure 1:
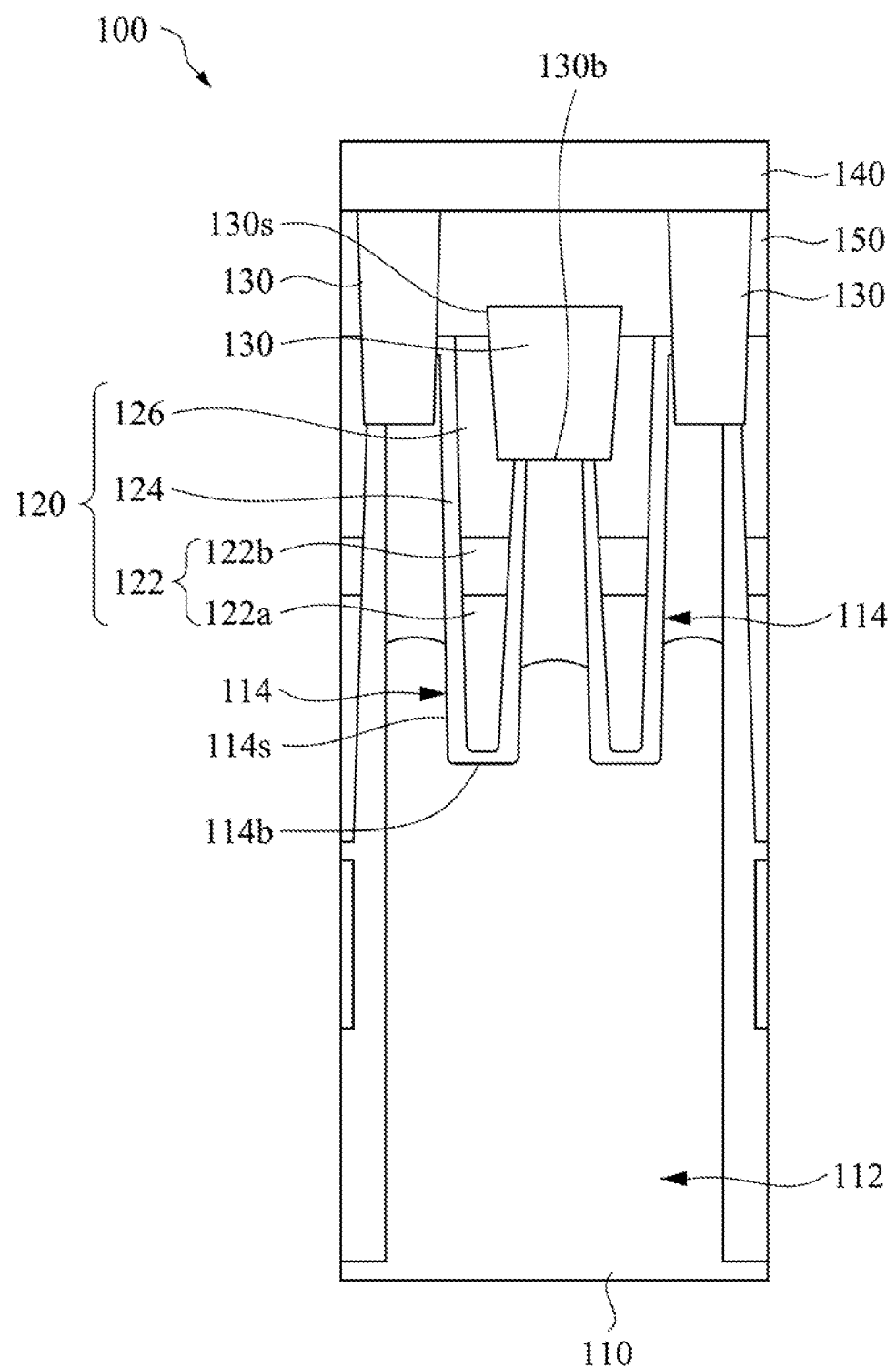
FIG. 1 is a partial schematic cross-sectional view of a memory structure in accordance with some embodiments of the present disclosure.

The embodiments of the present disclosure are discussed in detail below. However, it will be appreciated that the embodiments provide many applicable concepts that can be implemented in various specific contents. The embodiments discussed and disclosed are for illustrative purposes only and are not intended to limit the scope of the present disclosure. All of the embodiments of the present disclosure disclose various different features, and these features may be implemented separately or in combination as desired.

In addition, the terms "first", "second", and the like, as used herein, are not intended to mean a sequence or order, and are merely used to distinguish elements or operations described in the same technical terms.

The spatial relationship between two elements described in the present disclosure applies not only to the orientation depicted in the drawings, but also to the orientations not represented by the drawings, such as the orientation of the inversion. Furthermore, the terms "connected", "electrically connected" or the like between two components referred to in the present disclosure are not limited to the direct connection or electrical connection of the two components, and may also include indirect connection or electrical connection as required.

Referring to FIG. 1, FIG. 1 is a partial schematic cross-sectional view of a memory structure in accordance with some embodiments of the present disclosure. A memory structure 100 may be a dynamic random access memory structure. The memory structure 100 may mainly include a substrate 110, a word line structure 120, a bit line contact 130, and a bit line 140. In some examples, the memory structure 100 includes various word line structures 120, various bit line contacts 130, and various bit lines 140.

The substrate 110 may be, for example, a silicon substrate, a silicon germanium substrate, a gallium arsenide substrate, or a semiconductor-on-insulator (SOI) substrate. The substrate 110 may include one or more channel regions 112. The channel regions 112 may be formed by implanting dopants into the substrate 110. The substrate 110 may have one or more trenches 114. For example, the trenches 114 may be formed by removing portions of the substrate 110. In some exemplary examples, the trenches 114 extend into the channel region 112.

The word line structure 120 is disposed in the trench 114 of the substrate 110, such that the word line structure 120 is embedded in the substrate 110. For example, a top of the word line structure 120 may be substantially flushed with a top of the substrate 110. In some examples, the word line structure 120 includes a word line 122, a gate dielectric layer 124, and a capping layer 126. The gate dielectric layer 124 may be formed on a bottom surface 114$b$ and a side surface 114$s$ of the trench 114. For example, the gate dielectric layer 124 may conformally cover the bottom surface 114$b$ and the side surface 114$s$ of the trench 114. The gate dielectric layer 124 may be formed by using, for example, a chemical vapor deposition (CVD) technique, a physical vapor deposition (PVD) technique, or an atomic layer deposition (ALD) technique. A material of the gate dielectric layer 124 may include any suitable dielectric material, such as silicon oxide.

The word line 122 is disposed in the trench 114 on the gate dielectric layer 124, such that the gate dielectric layer 124 is located between the word line 122 and the substrate 110. The word line 122 may fill a portion of the trench 114. The word line 122 may be a single-layered structure, or may be a multi-layered structure. In some examples, the word line 122 is a dual work function work line. The word line 122 may include a first layer 122$a$ and a second layer 122$b$, in which the second layer 122$b$ is disposed on the first layer 122$a$, and the first layer and the second layer have different materials. In some examples, a material of the first layer 122$a$ includes metal, and a material of the second layer 122$b$ includes semiconductor. For example, the material of the first layer 122$a$ may include tungsten, and the material of the second layer 122$b$ may include polysilicon. The second layer 122$b$ may be formed of polysilicon with the desired conductivity type. The second layer 122$b$ may be formed of $N^+$ polysilicon. For example, the first layer 122$a$ and the second layer 122$b$ may be formed by using a chemical vapor deposition technique or a physical vapor deposition technique.

The capping layer 126 is disposed on the word line 122 and covers the word line 122. An average dielectric constant of the entire capping layer 126 is smaller than a dielectric constant of silicon nitride, which is used for a capping layer of a word line structure of a conventional memory structure. The capping layer 126 may include at least one material having a dielectric constant smaller than the dielectric constant of silicon nitride. In some examples, an etching selectivity of the capping layer 126 is higher than that of silicon nitride. The capping layer 126 may be a single-layered structure, or may be a multi-layered structure, such as a double-layered structure or a structure includes more than two layers stacked with each other.

In the example shown in FIG. 1, the capping layer 126 is a single-layered structure. Specifically, the capping layer 126 is consisting of a first material film, and a dielectric constant of the first material film is smaller than the dielectric constant of silicon nitride. For example, the first material film of the capping layer 126 may include silicon oxide, or any suitable dielectric material with a dielectric constant smaller than that of silicon nitride. In some examples, the capping layer 126 may be formed by using a chemical vapor deposition technique or a physical vapor deposition technique.

The bit line contact 130 is disposed on a portion of the trench 114 and a portion of the capping layer 126. The bit line contact 130 is formed of a conductive material, such as silicon. In some examples, the memory structure 100 further includes an isolation layer 150, in which the isolation layer 150 is disposed on the capping layer 126 and the gate dielectric layer 124. The isolation layer 150 is formed of a dielectric material. For example, a material of the isolation layer 150 may include silicon nitride or any suitable dielectric material. The isolation layer 150 may be formed by using a chemical vapor deposition technique or a physical vapor deposition technique. The bit line contact 130 may be formed in the isolation layer 150 and on the portion of the trench and the portion of the capping layer by using, for example, a photolithography technique, an etching technique, and a deposition technique, such as a chemical vapor deposition technique or a physical vapor deposition technique.

The bit line 140 is disposed over the bit line contact 130. For example, the bit line 140 is disposed on the isolation layer 150 over the bit line contact 130. The bit line 140 is electrically connected to the bit line contact 130. For example, the bit line 140 may be in contact with the bit line contact 130. A material of the bit line 140 may include metal, polysilicon, or any suitable conductive material. The bit line 140 may be formed by using a chemical vapor deposition technique or a physical vapor deposition technique.

The capping layer 126 of the word line structure 120 is formed of the material with the dielectric constant lower than that of the conventional material, such that the bit line parasitic capacitance is reduced, and the electric field generated by the bit line 140 is lowered to decrease the gate induced drain leakage current. Therefore, a signal margin of the memory structure 100 during operation is increased.

Figure 2:
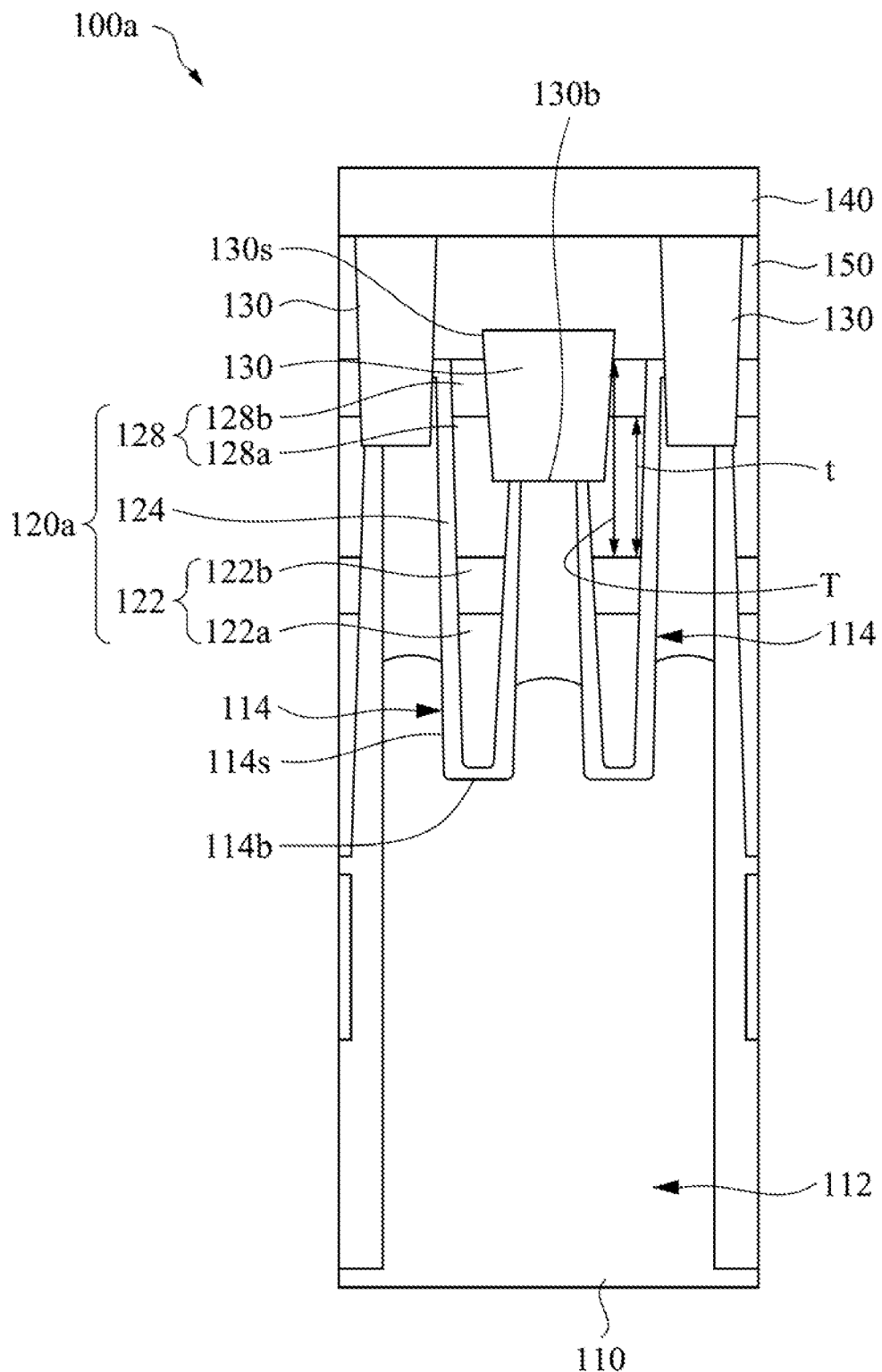
FIG. 2 is a partial schematic cross-sectional view of a memory structure in accordance with some embodiments of the present disclosure.

Referring to FIG. 2, FIG. 2 is a partial schematic cross-sectional view of a memory structure in accordance with some embodiments of the present disclosure. A structure of a memory structure 100a of the present embodiment is similar to that of the memory structure 100 shown in FIG. 1. A difference between the memory structures 100 and 100a is that, a capping layer 128 of a word line structure 120a of the memory structure 100a is a double-layered structure.

In the memory structure 100a, the capping layer 128 of a word line structure 120a includes a first material film 128a and a second material film 128b, in which the second material film 128b is disposed on the first material film 128a. A material of the first material film 128a is different from that of the second material film 128b. Specifically, the first material film 128a and the second material film 128b have different dielectric constants. In some exemplary examples, an average dielectric constants of the first material film 128a and the second material film 128b is smaller than a dielectric constant of silicon nitride.

In some examples, the dielectric constant of the first material film 128a is smaller than that of the second material film 128b. In such examples, the first material film 128a may include silicon oxide or any suitable low dielectric material, and the second material film 128b may include silicon nitride. In addition, a thickness t of the first material film 128a may be substantially 20% or more than 20% of a thickness T of the capping layer 128. For example, the thickness t of the first material film 128a may be from substantially 20% to substantially 100% of the thickness T of the capping layer 128. In some exemplary examples, the first material film 128a extends at least from a side surface 130s of the bit line contact 130 beyond a bottom surface 130b of the bit line contact 130. Furthermore, an etching selectivity of the first material film 128a may be higher than that of silicon nitride.

In some certain examples, the dielectric constant of the first material film 128a is greater than that of the second material film 128b.

In the examples that the capping layer including several material films, one or more material films with lower dielectric constants in the capping layer are not required to be placed on the bottom of the capping layer, as long as an average dielectric constant of the capping layer is lower than that of the conventional capping layer of the memory structure.

Figure 3:
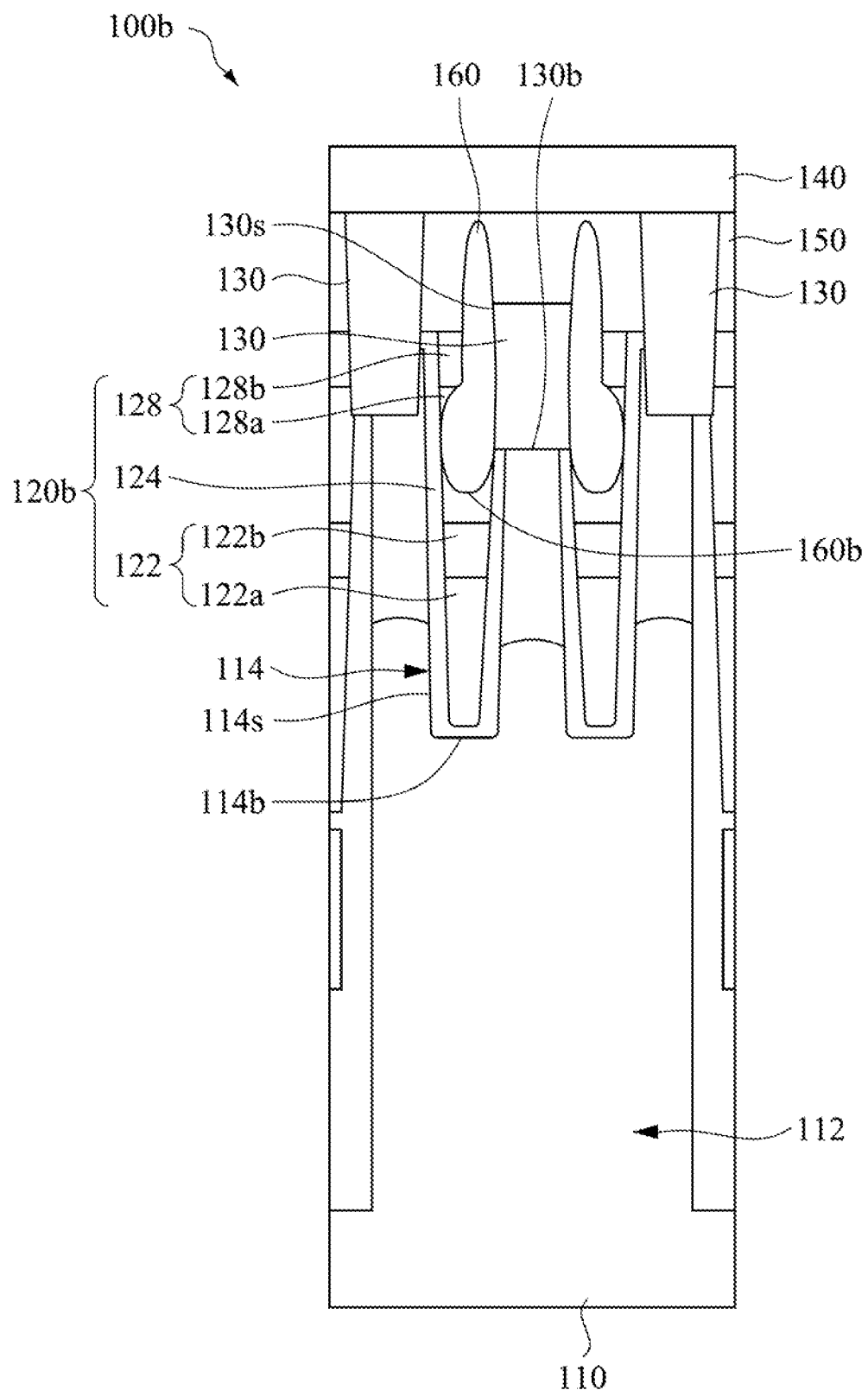
FIG. 3 is a partial schematic cross-sectional view of a memory structure in accordance with some embodiments of the present disclosure.

Referring to FIG. 3, FIG. 3 is a partial schematic cross-sectional view of a memory structure in accordance with some embodiments of the present disclosure. A structure of a memory structure 100b of the present embodiment is similar to that of the memory structure 100a shown in FIG. 2. A difference between the memory structures 100a and 100b is that, the memory structure 100b further includes an air gap 160.

In the memory structure 100b, the air gap 160 is at least disposed in the capping layer 128 and is adjacent to the side surface 130s of the bit line contact 130. In some examples, a bottom 160b of the air gap 160 is lower than the bottom surface 130b of the bit line contact 130. In some exemplary examples, the air gap 160 extends from the isolation layer 150 along the side surface 130s of the bit line contact 130 beyond the bottom surface 130b of the bit line contact 130. In such examples, the etching selectivity of the first material film 128a is greater than that of the dielectric material used for the capping layer of the conventional memory structure, such that the air gap 160 successfully extends beyond the bottom surface 130b of the bit line contact 130.

With the air gap 160, the dielectric constant of the structure between the word line 122 and the bit line 140 is reduced, such that the bit line parasitic capacitance is further reduced, and the electric field generated by the bit line 140 is lowered, thereby decreasing the gate induced drain leakage current. Accordingly, a signal margin of the memory structure 100b is increased.

Although the present embodiment is exemplified by the capping layer 128 having a double-layered structure, the air gap 160 may also be provided in the memory structure 100. In such examples, referring to FIG. 1, the air gap 160 is at least disposed in the capping layer 126 and is adjacent to the bit line contact 130. In some exemplary examples, the air gap 160 extends from the isolation layer 150 along the side surface 130s of the bit line contact 130 beyond the bottom surface 130b of the bit line contact 130.

According to the aforementioned embodiments, one advantage of the present disclosure is that a low dielectric constant material is used to form a capping layer of a word line structure of a memory structure, such that the bit line parasitic capacitance is reduced, and the gate induced drain leakage current is lowered, thereby increasing a signal margin of the memory structure during operation.

Although the present disclosure has been described in considerable details with reference to certain embodiments, the foregoing embodiments of the present disclosure are illustrative of the present disclosure rather than limiting of the present disclosure. It will be apparent to those having ordinary skill in the art that various modifications and variations can be made to the present disclosure without departing from the scope or spirit of the disclosure. Therefore, the spirit and scope of the appended claims should not be limited to the description of the embodiments contained herein.

What is claimed is:
1. A memory structure, comprising:
a substrate having a trench;
a word line structure disposed in the trench of the substrate, wherein the word line structure comprises:

a word line disposed in the trench;
a gate dielectric layer disposed between the word line and the substrate; and
a capping layer covering the word line, wherein the capping layer comprises a first material film, and a dielectric constant of the first material film is smaller than a dielectric constant of silicon nitride;
a bit line contact disposed on a portion of the trench and a portion of the capping layer, wherein the first material film extends at least from a side surface of the bit line contact beyond a bottom surface of the bit line contact;
a bit line disposed over the bit line contact and electrically connected to the bit line contact; and
an air gap disposed in the capping layer adjacent to the side surface of the bit line contact, wherein a bottom of the air gap is lower than the bottom surface of the bit line contact.

2. The memory structure of claim 1, wherein the word line comprises a first layer and a second layer on the first layer, and the first layer and the second layer have different materials.

3. The memory structure of claim 2, wherein a material of the first layer comprises metal, and a material of the second layer comprises semiconductor.

4. The memory structure of claim 2, wherein a material of the first layer comprises tungsten, and a material of the second layer comprises polysilicon.

5. The memory structure of claim 1, wherein the gate dielectric layer conformally covers a bottom surface and a side surface of the trench.

6. The memory structure of claim 1, wherein the first material film of the capping layer comprises silicon oxide.

7. The memory structure of claim 1, wherein the capping layer further comprises a second material film disposed on the first material film, and a dielectric constant of the second material film is different from a dielectric constant of the first material film.

8. The memory structure of claim 7, wherein the dielectric constant of the second material film is greater than the dielectric constant of the first material film.

9. The memory structure of claim 8, wherein the second material film comprises silicon nitride.

10. The memory structure of claim 8, wherein a thickness of the first material film is 20% or more than 20% of a thickness of the capping layer.

11. A memory structure, comprising:
a substrate having a trench;
a word line structure disposed in the trench of the substrate, wherein the word line structure comprises:
a word line disposed in the trench;
a gate dielectric layer disposed between the word line and the substrate; and
a capping layer disposed in the trench and covering the word line, wherein the capping layer comprises a first material film and a second material film disposed on the first material film, and a dielectric constant of the first material film is different from a dielectric constant of the second material film;
an isolation layer disposed on the capping layer and the gate dielectric layer;
a bit line contact disposed in the isolation layer and on a portion of the trench and a portion of the capping layer, the first material film extends at least from a side surface of the bit line contact beyond a bottom surface of the bit line contact;
a bit line disposed over the bit line contact and electrically connected to the bit line contact; and
an air gap disposed in the capping layer adjacent to the side surface of the bit line contact, wherein a bottom of the air gap is lower than the bottom surface of the bit line contact.

12. The memory structure of claim 11, wherein the word line comprises a first layer and a second layer on the first layer, and the first layer and the second layer have different materials.

13. The memory structure of claim 12, wherein a material of the first layer comprises tungsten, and a material of the second layer comprises polysilicon.

14. The memory structure of claim 11, wherein the dielectric constant of the first material film is smaller than the dielectric constant of the second material film.

15. The memory structure of claim 14, wherein a thickness of the first material film is 20% or more than 20% of a thickness of the capping layer.

16. The memory structure of claim 11, wherein the air gap extends from the isolation layer along the side surface of the bit line contact beyond the bottom surface of the bit line contact.

* * * * *